(12) United States Patent
Joo

(10) Patent No.: US 8,471,537 B2
(45) Date of Patent: Jun. 25, 2013

(54) LOW POWER HIGH VOLTAGE REGULATOR FOR NON-VOLATILE MEMORY DEVICE

(75) Inventor: Young Dong Joo, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 307 days.

(21) Appl. No.: 12/969,571

(22) Filed: Dec. 15, 2010
(Under 37 CFR 1.47)

(65) Prior Publication Data
US 2011/0227553 A1 Sep. 22, 2011

(30) Foreign Application Priority Data

Dec. 15, 2009 (CN) .......................... 2009 1 0201187

(51) Int. Cl.
*G05F 1/577* (2006.01)
*H02M 3/18* (2006.01)
*H02M 7/00* (2006.01)
(52) U.S. Cl.
USPC ............................................ 323/267; 363/60
(58) Field of Classification Search
USPC ................... 323/266–268, 270–271; 363/60
See application file for complete search history.

(56) References Cited

U.S. PATENT DOCUMENTS

| | | | |
|---|---|---|---|
| 6,107,862 A * | 8/2000 | Mukainakano et al. | ......... 363/60 |
| 6,411,531 B1 * | 6/2002 | Nork et al. | ....................... 363/60 |
| 7,486,573 B2 | 2/2009 | Jeon et al. | |
| 2002/0145892 A1 | 10/2002 | Shor et al. | |
| 2002/0196007 A1 | 12/2002 | Descombes | |
| 2003/0098738 A1 | 5/2003 | Descombes | |
| 2004/0178776 A1 * | 9/2004 | Hansen et al. | ................ 323/266 |
| 2008/0157733 A1 * | 7/2008 | Williams | ....................... 323/266 |
| 2011/0156670 A1 * | 6/2011 | Tadeparthy et al. | .......... 323/273 |

* cited by examiner

*Primary Examiner* — Jue Zhang
(74) *Attorney, Agent, or Firm* — Kilpatrick Townsend & Stockton LLP

(57) ABSTRACT

A high-voltage regulator includes a charge pump for generating a high voltage, a voltage regulator for generating a regulated voltage, and an oscillator having an oscillation frequency. The voltage regulator includes an operational amplifier having the high voltage as power supply, a first input, a second input coupled to a voltage reference, and an output. The voltage regulator further includes a first transistor having gate coupled to the output of the operational amplifier, a first terminal coupled to the high voltage and a second terminal coupled to a first voltage divider. The first voltage divider generates a first divided voltage that is coupled to the first input of the operational amplifier. The voltage regulator also includes a second voltage divider for providing a second divided voltage, wherein the second divided voltage controls the oscillator frequency.

15 Claims, 9 Drawing Sheets

LOW POWER HIGH VOLTAGE REGULATOR FOR NON-VOLATILE MEMORY DEVICE

CROSS-REFERENCES TO RELATED APPLICATIONS

This application claims priority to Chinese Patent Application No. 200910201187.0, filed Dec. 15, 2009, which is commonly owned and incorporated by reference herein for all purposes.

BACKGROUND OF THE INVENTION

Embodiments of the present invention relate to a semiconductor memory device, and more particularly, to a low-power high-voltage regulator for a non-volatile memory device.

Flash memory is a type of nonvolatile memory device that is widely used in memory cards, computers, mobile electronic products, such as mobile phones, digital cameras, portable music players, and the like, thank to its ability to retain data without requiring the presence of a power supply. EEPROM is another example of nonvolatile memory devices. Generally, a flash memory device requires a high voltage for programming data and erasing the stored data. Such a high voltage is generally generated through a charge pump circuit provided in the flash memory device.

In general, data in a flash memory device is stored by means of channel hot electron effects and erased by means of the Fowler-Nordheim (F-N) tunneling effect.

Since data programming into nonvolatile memory cells by means of channel hot electron injection requires a high-voltage regulator that can drive a large load current, it is seen that an improved high-voltage regulator consuming relatively low power is desired for nonvolatile memory devices.

BRIEF SUMMARY OF THE INVENTION

Embodiments of the present invention relate to a semiconductor memory device, and more particularly to a low power high-voltage regulator for non-volatile memory devices. Merely by way of example, embodiments of the invention provide a low-power voltage regulator for controlling a charge pump circuit for non-volatile memory devices.

In an embodiment of the present invention, a high-voltage regulator includes a charge pump configured t generate a high voltage, a voltage regulator configured to generate a regulated voltage, and an oscillator circuit having an oscillator frequency. The oscillator circuit may include a control circuit to generate control signals for the charge pump. In an embodiment, the voltage regulator includes a first transistor coupled to a first voltage divider; the first transistor includes a first terminal coupled to the high voltage and a second to the first voltage divider that generates a first control signal. The voltage regulator further includes an operational amplifier having a first input coupled to the first control signal, a second input coupled to a reference voltage, and an output coupled to a gate of the first transistor. The operational amplifier receives its power supply from the high voltage of the charge pump. The voltage regulator additionally includes a second voltage divider for generating a second control signal, the second control signal is used to control the oscillation frequency. In an embodiment, the oscillator circuit is a ring oscillator having an odd number of CMOS inverters connected in series. The output of the last CMOS inverter is connected to the input of the first CMOS inverter to form a ring. In an embodiment, the oscillator circuit includes a second transistor that is interposed between the power supply and the ring oscillator. The second transistor is used to control a supply current for the ring oscillator.

In another exemplary embodiment according to the inventive principles of this patent disclosure, a high-voltage regulator with low-power consuming charge pump circuit for generating an internal voltage for nonvolatile memory devices includes a charge pump for generating a high voltage, a voltage regulator coupled to the charge pump and being configured to generate a regulated voltage for programming and erasing data in the nonvolatile memory devices, and an oscillator circuit for generating a control signal to control the charge pump. In an embodiment, the high-voltage regulator further includes a buffer circuit that is interposed between the voltage regulator and the oscillator circuit.

In an embodiment, the buffer circuit is a voltage-controlled current generator including current mirrors for supplying respective currents to a first resistor and a second resistor. The first resistor generates a first control signal and the second resistor generates a second control signal. In an embodiment, the first control signal is fed back to a second operational amplifier for maintaining a constant current mirror. And the second control signal is used to control the current supplying the oscillator circuit.

Many benefits are achieved by way of embodiments of the present invention over conventional techniques. The present invention offers significant and unobvious advantages in the design of high voltage regulator with low-power consuming charge pump circuit for generating an internal voltage for nonvolatile memory devices. For example, a voltage regulator according to the present invention provides a high voltage regulator with low power consuming charge pump circuit for generating a high voltage for programming of nonvolatile memory cells. Additionally, the present voltage regulator with low-power consuming charge pump circuit provides reduced frequency characteristics for voltage-controlled ring oscillators.

Depending upon the embodiment, one or more of these benefits may be achieved. These and other benefits will be described in more throughout the present specification and more particularly below. Various additional embodiments, features, and advantages of the present invention, as well as the structure and operation of the various embodiments of the present invention, are described in detail below with reference to the accompanying drawings.

BRIEF DESCRIPTION OF THE DRAWINGS

The present invention is illustrated by way of example and not limitations in the figures of the accompanying drawings, in which like references indicate similar elements, and in which.

Exemplary embodiments of the invention are more fully described in detail with reference to the accompanied drawings. The invention may be embodied in many different forms and should not be construed as being limited to the exemplary embodiments set forth herein. Rather, these exemplary embodiments are provided so that this disclosure is thorough and complete, and to convey the concepts of the invention to those skilled in the art.

DETAILED DESCRIPTION OF THE INVENTION

The present invention generally relates to a semiconductor integrated circuit device, and particularly to a charge pump circuit for producing an internal voltage for non-volatile memory devices. Preferred embodiments in accordance with the inventive principles of this patent disclosure will be described below in more detail with reference to the accompanying drawings. The inventive principles may, however, be embodied in different forms and should not be construed as limited to the embodiments set forth herein. Rather, these embodiments are provided as instructive examples to those skilled in the art.

It is also understood that the examples and embodiments described herein are for illustrative purposes only and that various modifications or changes in light thereof will be suggested to persons skilled in the art and are to be included within the spirit and purview of this application and scope of the appended claims.

Figure 1:
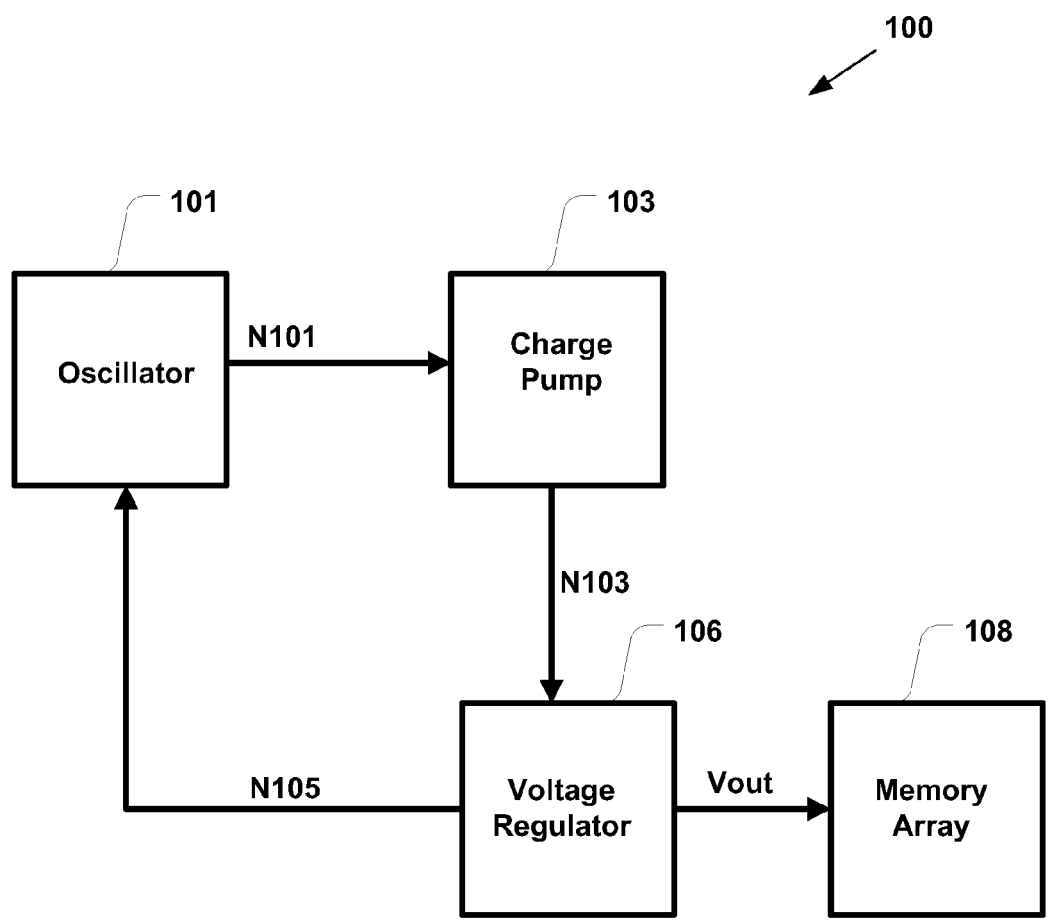
FIG. 1 is a simplified block diagram of an example voltage regulator for a flash memory device, in according with an example embodiment of the present invention.

FIG. 1 is a simplified block diagram of an example high voltage regulator 100 for nonvolatile memory devices according to one example embodiment of the present invention. The high voltage regulator includes an oscillator 101 for generating control signals for a charge pump 103 that provides a high voltage N103 to a voltage regulator 106. The voltage regulator provides a first regulated output voltage Vout to a memory array and a feedback voltage N105 to the oscillator.

Figure 2A:
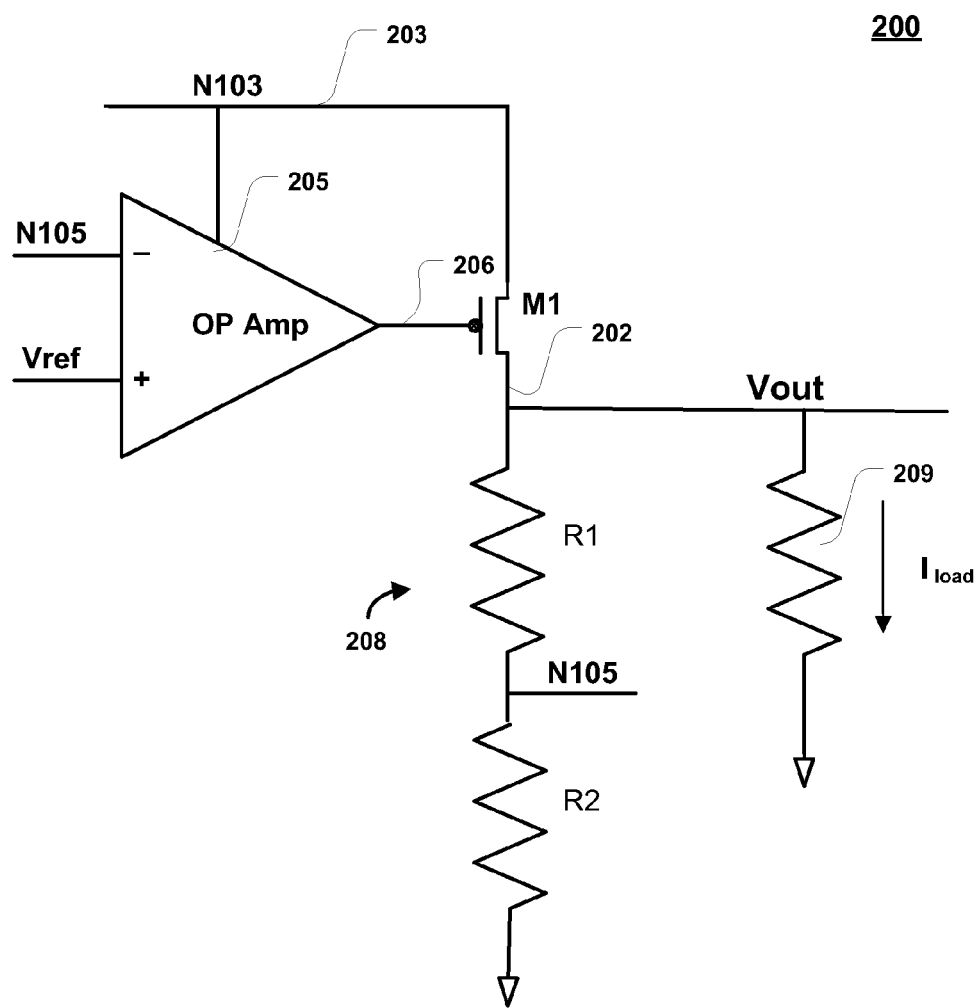
FIG. 2A is a circuit diagram illustrating a high voltage regulator for a flash memory devices, in according with an example embodiment of the present invention.

FIG. 2A is a simplified circuit diagram illustrating an exemplary high voltage regulator 200 for providing a feedback signal to the oscillator. The high voltage regulator includes an Op Amp 205 having the high voltage N103 from the charge pump as power supply and a first input terminal and a second input terminal and an output terminal. The high voltage regulator further includes a PMOS transistor M1 having a gate terminal coupled to the output terminal of the Op Amp and a source coupled to high voltage N103 and a drain that provides the regulated output voltage to the memory array 108 shown in FIG. 1. Additionally, the high voltage regulator includes a resistor divider 208 coupled to the regulated output and a ground potential to generate the feedback voltage signal N105. The OP Amp 205 compares the feedback voltage N105 to a reference voltage Vref to produce a comparison output signal 206, which controls the current flow of transistor M1. The drain terminal 202 of the PMOS transistor M1 is also connected to a load resistor 209. Load resistor 209 is connected between the output voltage Vout and ground or a voltage potential. The current Iload represents a load current across the load resistor 209. For example, the load can be a memory array shown in FIG. 1. Generally, Iload decreases during the programming of nonvolatile memory cells due to hot carrier injections into the floating gate of nonvolatile memory cells.

Figure 2B:
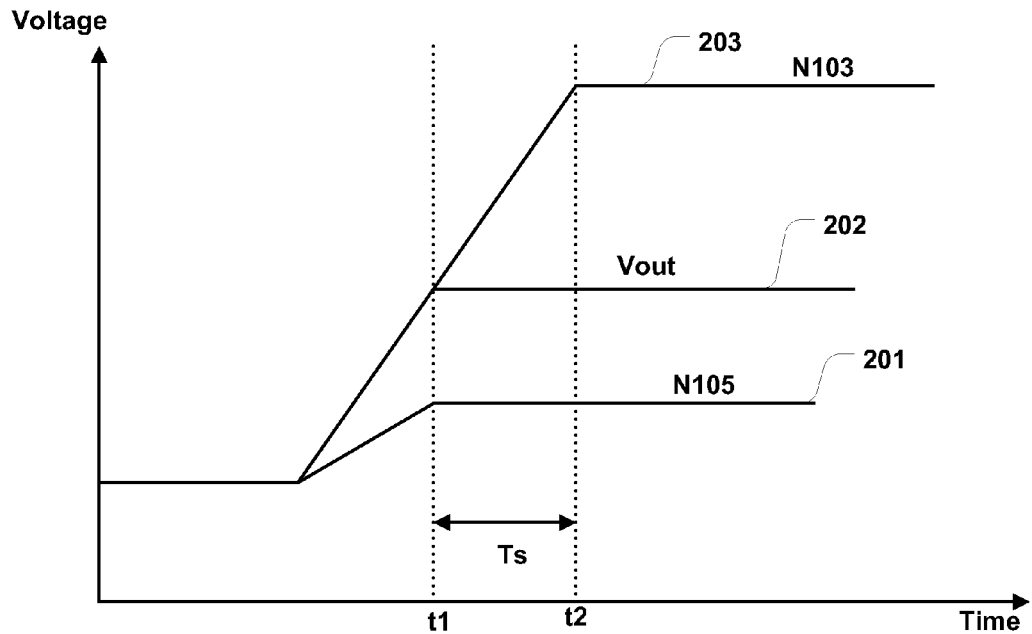
FIG. 2B is a schematic voltage timing diagram of a high voltage regulator of FIG. 2A, in accordance with an example embodiment of the present invention.

FIG. 2B is a schematic voltage timing diagram of a high voltage regulator of FIG. 2A. Voltage waveforms 201, 202, and 203 represent the respective voltages at the node N105 of the voltage divider 208, at the drain terminal of PMOS transistor M1, and at the charge pump output node N103. As the output voltage Vout increases, the divided voltage N105 at the resistor divider 208 also increases proportionally. When the divided voltage N105 is equal to or higher than Vref, the OP Amp output 206 goes high, turning off PMOS transistor M1 to regulate output voltage Vout of the voltage regulator 200. When Vout at node 202 is lower than a predetermined voltage or the divider output voltage N105 is lower than the reference voltage Vref, the Op Amp turns on PMOS transistor M1, which then increases the output voltage Vout. Charge pump output voltage N103 at node 203 rises to its maximum value at t=t2. The time interval Ts represents additional time required for the charge pump output voltage to reach its maximum value after Vout reaches its target or nominal operating value.

Figure 2C:
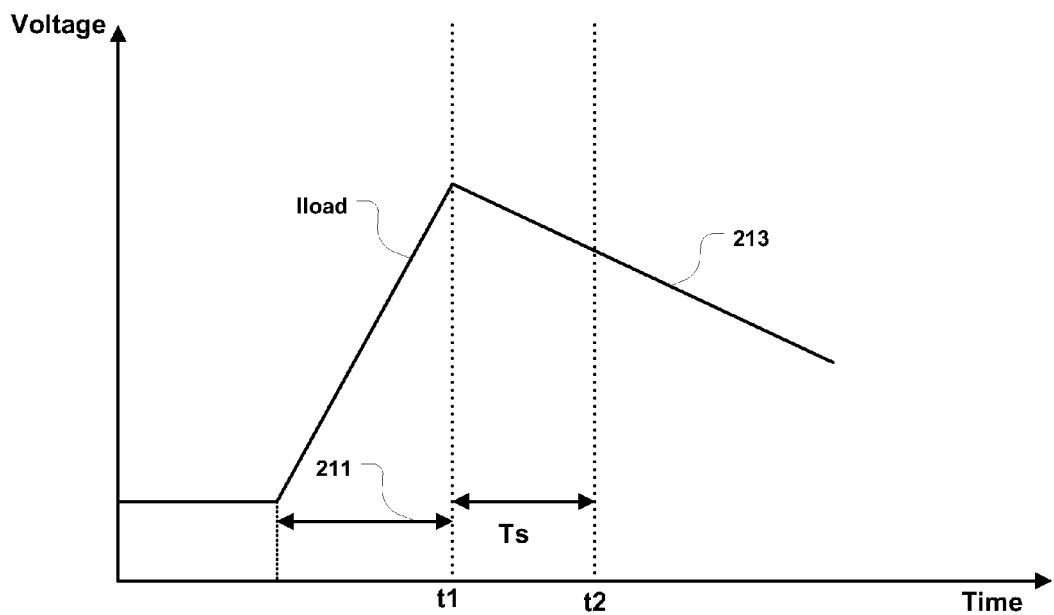
FIG. 2C is a schematic current load timing diagram of a high voltage regulator of FIG. 2A, in accordance with an example embodiment of the present invention.

FIG. 2C is a schematic load current timing diagram of a high voltage regulator of FIG. 2A. Load current Iload across load resistor 209 shown in FIG. 2A increases during the time interval 211 as output voltage Vout increases. At t=t1, a programming process (e.g., writing data to a memory cell) starts, the load current (Iload) gradually decreases in time interval 213. The current decrease is caused by hot electron injections into the floating gate that results in an increase in the threshold voltage increase, which in turn causes a decrease of the load current through the load resistor 209 (a nonvolatile memory array).

Figure 3:
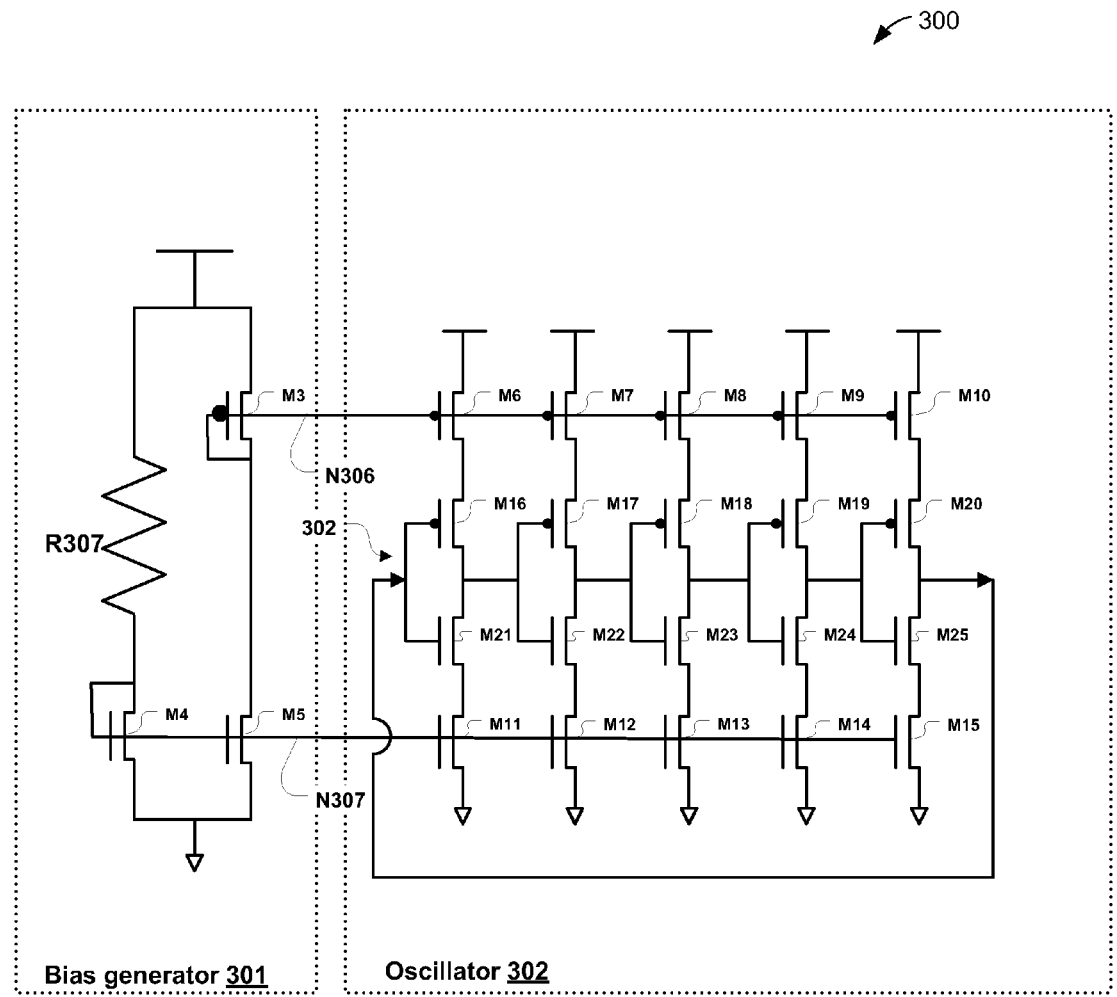
FIG. 3 is a schematic circuit diagram of an example voltage-controlled ring oscillator.

FIG. 3 is a schematic circuit diagram of an example of a voltage-controlled ring oscillator 300. The voltage-controlled ring oscillator includes a bias generator 301 and a ring oscillator 302. The ring oscillator, as an example, includes five CMOS inverters (M16-M21, M17-M22, . . . , M20-M25) connected in series with the output of the last inverter M20-M25 coupled to the first inverter M16-M21 to form an oscillating ring.

The bias generator 301 controls the load currents of the ring oscillator. The NMOS transistors M4 and M5 of the bias generator 300 perform as a current mirror. The current mirror has a function to copy (mirror) a current flowing through one active device by controlling the current in another active device of a circuit, keeping the output current constant regardless of loading. The current being 'mirrored' can be a varying signal current. Other NMOS transistors M11-M15 are current mirrors of transistor M4 and PMOS transistors M6-M10 are current mirrors of PMOS transistor M3. The bias voltages at nodes N306 and N307 control the respective threshold voltage of PMOS transistors M6-M10 and NMOS transistors M11-M15. As shown in FIG. 3, PMOS transistors M6-M10 are connected to respective PMOS transistors M16-M20 in series and NMOS transistors M21-M25 are connected to NMOS M11-M5 in series to form a voltage-controlled ring oscillator.

Figure 4A:
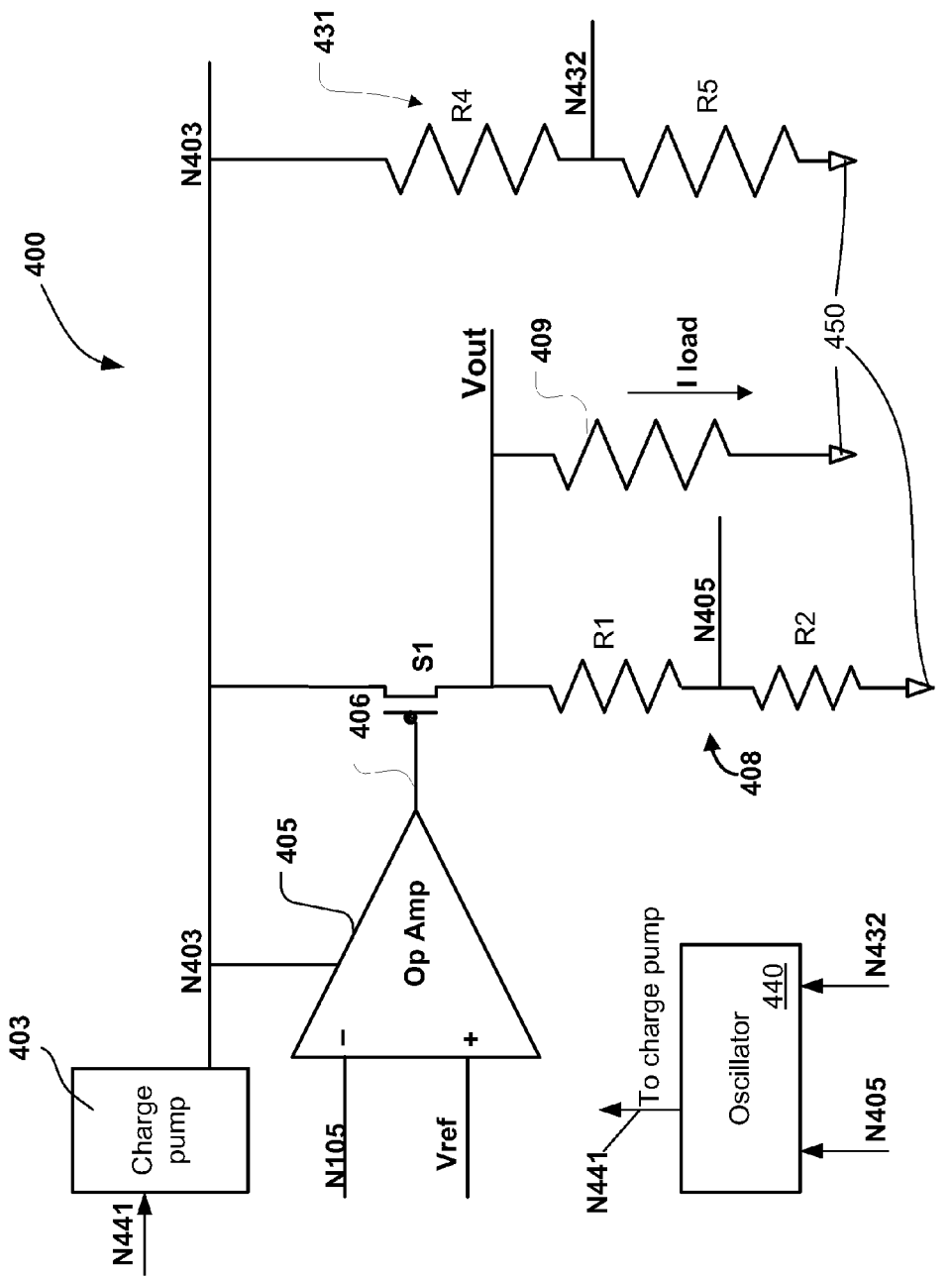
FIG. 4A is a schematic circuit diagram of a high voltage regulator, in according with an example embodiment of the present invention.

FIG. 4A is a schematic circuit diagram of a high voltage regulator 400 according to an embodiment of the present invention. This diagram is merely an example, which should not unduly limit the scope of the claims. One of ordinary skill in the art would recognize many variations, alternatives, and modifications. Referring to FIG. 4A, the high voltage regulator includes a charge pump 403 that provides a high voltage N403, a switch S1 having a first terminal coupled to the high voltage N403 of the charge pump and a second terminal coupled to a voltage divider 408. In an embodiment, the switch can provide a regulated high voltage Vout to the voltage divider at the second terminal. In an embodiment, the voltage divider can be a resistor divider having a resistor R1 and a resistor R2 connected in series between the second terminal of the switch S1 and a voltage potential 450; the voltage divider provides a divided voltage N405 that is proportional to Vout. In an embodiment, the voltage potential 450 can have a ground potential. The high voltage regulator further includes a comparator 405 having a first input coupled to the divided voltage N405 and a second input coupled to a reference voltage. The comparator outputs a control signal 406 to turn on and off switch S1. In an embodiment, the switch can be a PMOS transistor having a source coupled to the high voltage output N403 of the charge pump, a drain coupled to the voltage divider 408, and a gate coupled to the output of the comparator.

Referring to FIG. 4A, a resistive load representing by a resistor 409 is coupled to the regulated voltage Vout. Iload is the load current flowing across the load resistor 409. The high voltage regulator further includes a second voltage divider 431 that is coupled between the charge pump output voltage N403 and the voltage potential. In an embodiment, the second voltage divider includes resistors R4 and R5 that provides a second divided voltage N432 from the charge pump output voltage N403. In an embodiment, the output voltage N432 is a control signal to a second switch for a ring oscillator, wherein the second switch is configured to provide a current to the ring oscillator. The function and characteristics of the second switch and the ring oscillator will be described in more detail below.

Figure 4B:
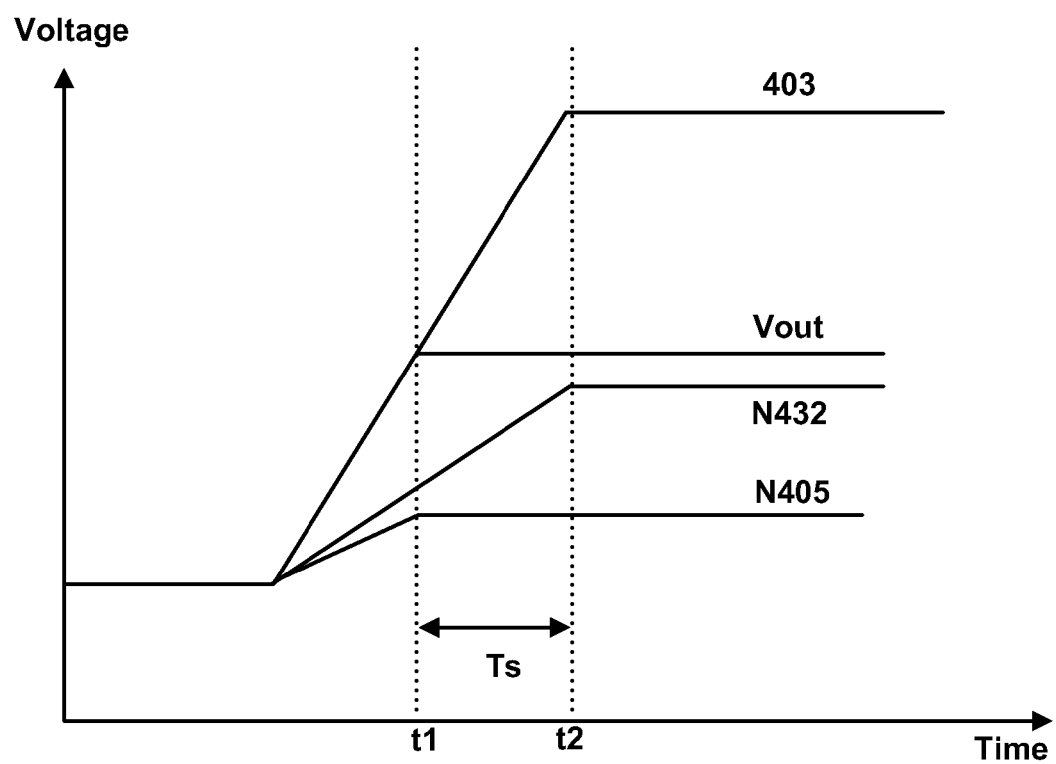
FIG. 4B is a schematic voltage timing diagram of a high voltage regulator of FIG. 4A, in according with an example embodiment of the present invention.

FIG. 4B is a schematic voltage timing diagram of a high voltage regulator of FIG. 4A. This diagram is merely an example, which should not unduly limit the scope of the claims. One of ordinary skill in the art would recognize many variations, alternatives, and modifications. As shown in FIG. 4B, the charge pump output voltage N403 rises to a voltage that can be much higher voltage than the voltage of the voltage regulator output voltage Vout. The second voltage divider 431 is adapted to produce an output voltage N432 that can be lower than Vout, but higher than the first voltage divider output N405. The output voltage N432 can be programmed by selecting suitable resistance values for the resistors R4 and R5 according to an embodiment.

Referring to FIG. 4A, oscillator 440 can be a ring oscillator as described above. The oscillator produces an oscillation frequency that depends on the supply voltage or the supply current. To increase the frequency of the oscillator, the supply voltage have to increase, and the increase in the supply voltage results in higher power consumption and heat dissipation. The power consumption and heat dissipation thus may limit the frequency of a given oscillator. An embodiment of the present invention provides technique to reduce a novel approach to solve the problem of high power consumption.

Figure 5:
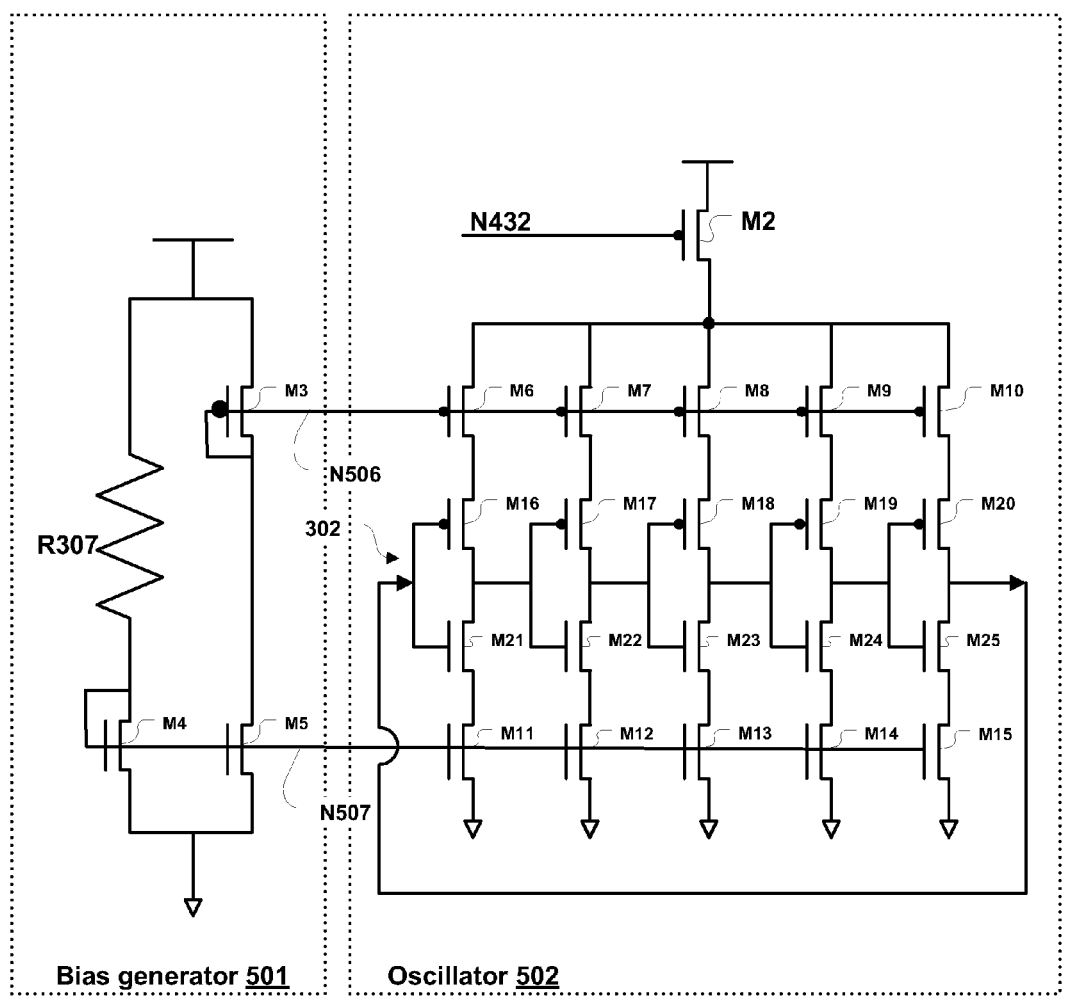
FIG. 5 is a schematic circuit diagram of a voltage-controlled ring oscillator according to an embodiment of the present invention.

FIG. 5 is a schematic circuit diagram of a voltage-controlled ring oscillator 500 according to an embodiment of the present invention. This diagram is merely an example, which should not unduly limit the scope of the claims. One of ordinary skill in the art would recognize many variations, alternatives, and modifications. The voltage-controlled ring oscillator includes a bias generator 501 and an oscillator 502.

In an embodiment, the bias generator can be similar to the one shown in FIG. 3. Oscillator 502 includes a current control circuit M2 that regulates the current supplying to the CMOS inverters of the ring oscillator N506. In an embodiment, the current control circuit can be a transistor having a terminal connected to the source terminals of PMOS transistors M6-M10 and a gate terminal being connected to the second voltage divider output N432 of FIG. 4A. With this inventive approach, transistor M2 is adapted to control the source current of the ring oscillator 502 to adjust the power consumption and the oscillation frequency of oscillator 502. Since the second divider output voltage N432 is proportional to the charge pump output voltage N403, it continues to increase until charge pump output voltage N403 reaches its maximum level as shown in FIG. 4B.

As the second divider output voltage N432 is provided to the gate terminal of transistor M2, the current flowing through transistor M2 can be modulated by varying the threshold voltage Vgs of the transistor. Thus, the overall power consumption and the oscillation frequency of oscillator 500 can be adjusted according to application requirements. In an embodiment, the transistor M2 is a PMOS transistor. In an embodiment, the power consumption and frequency of oscillator 502 can be reduced by increasing the voltage level of N432 through the values of resistors R4 and R5 of the second voltage divider. This is because the threshold voltage of PMOS transistor M2 is reduced due to the higher gate voltage, which produce lower drain current flowing through the transistor M2.

Figure 6:
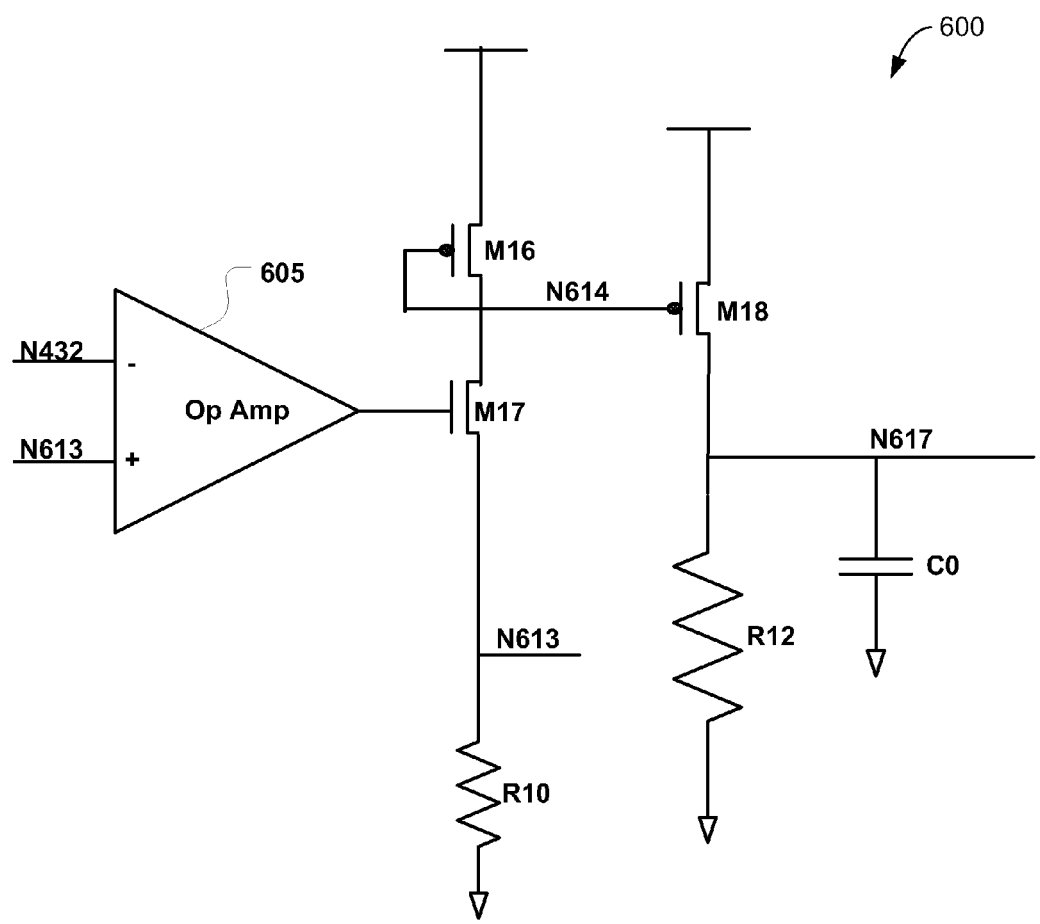
FIG. 6 is a schematic circuit diagram of a voltage-controlled current generator according to another embodiment of the present invention.

FIG. 6 is a simplified schematic circuit diagram of a voltage-controlled current generator 600 according to another embodiment of the present invention. This diagram is merely an example, which should not unduly limit the scope of the claims. One of ordinary skill in the art would recognize many variations, alternatives, and modifications. In an example embodiment, the voltage-controlled current generator can be used as a voltage buffer stage that is connected between the voltage regulator in FIG. 4A and the ring oscillator 502 in FIG. 5. In an exemplary embodiment, when the output voltage N432 of the voltage regulator shown in FIG. 4A does not have sufficient current driving capability, e.g., due to the relatively long connection line or large parasitic capacitance, the buffer circuit as shown in FIG. 6 can be used to provide additional current driving capability of the voltage regulator.

Referring to FIG. 6, the voltage-controlled current generator includes an Op Amp 605 having a first input terminal coupled to the voltage regulator output voltage N432, a second input terminal, and an out put terminal. The voltage-controlled current generator further includes a transistor M17 having a gate input coupled to the output of the OP Amp 605 and a drain coupled to a resistor R10. The interconnection node N613 of the drain and R10 is coupled to the second input terminal to provide a feedback signal to the OP Amp. Additionally, the voltage-controlled current generator includes transistors M16 and M18 that function as current mirrors and have their gates coupled together. As output voltage N432 increases, the drain current of transistor M17 also increases, which causes the voltage level at node N614 to decrease. The low voltage at N614, in turn, increases the threshold voltage of PMOS transistor M18 and output voltage N617. This increased output voltage N617 is input to the gate terminal of PMOS transistor M2 shown in FIG. 7 to adjust power consumption and frequency characteristics of the voltage-controlled ring oscillator shown in FIG. 7. This diagram is merely an example, which should not unduly limit the scope of the claims. One of ordinary skill in the art would recognize many variations, alternatives, and modifications.

Figure 7:
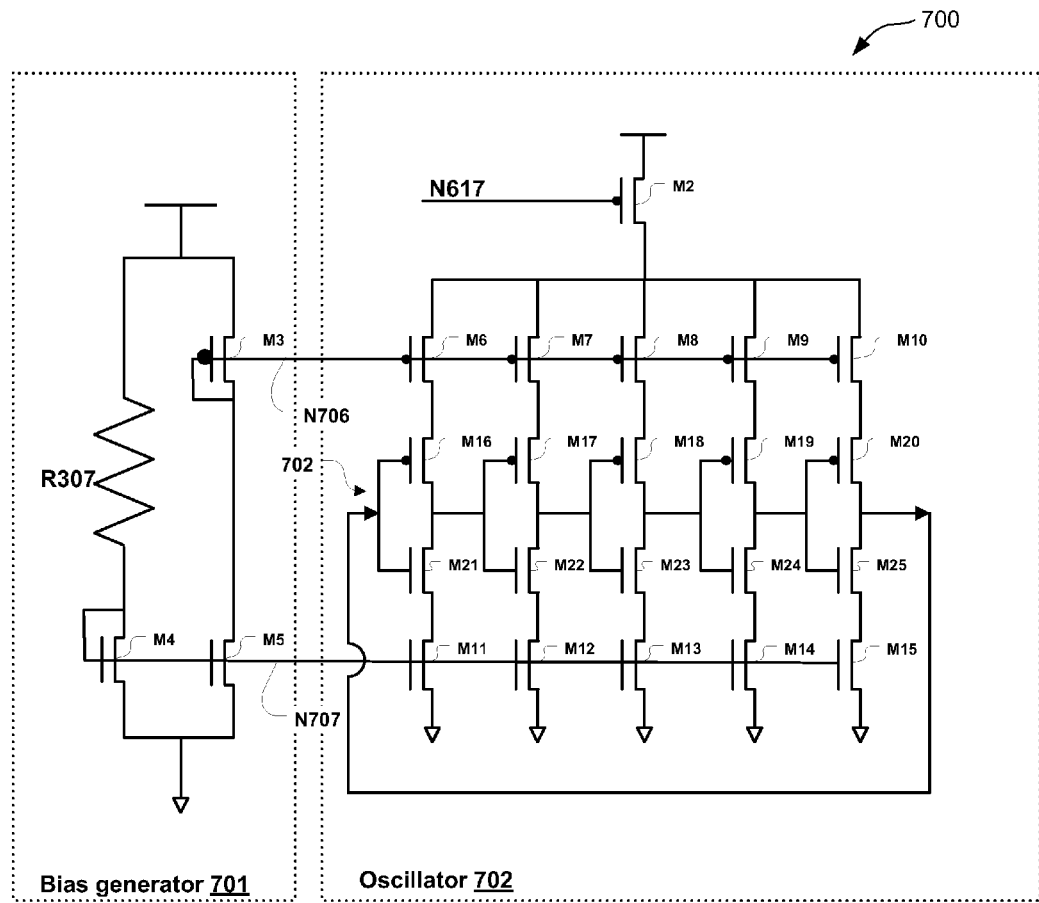
FIG. 7 is a schematic circuit diagram of a voltage-controlled ring oscillator according to another embodiment of the present invention.

FIG. 7 is a schematic circuit diagram of a voltage-controlled ring oscillator according to another embodiment of the present invention. This diagram is merely an example, which should not unduly limit the scope of the claims. One of ordinary skill in the art would recognize many variations, alternatives, and modifications. For example, a difference between the ring oscillator shown in FIG. 5 and FIG. 7 is input signal to gate terminal of PMOS transistor M2. In the present embodiment, output voltage N117 of the voltage-controlled current generator shown in FIG. 6 is input to the gate terminal of M2 transistor. As described above, drain current of transistor M2 or source current of oscillator is adjusted by providing output voltage N617 to the gate terminal of transistor M2, causing power consumption and frequency variations of the ring oscillator 702.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A high-voltage regulator comprising:
   a charge pump configured to generate a high voltage signal;
   a voltage regulator coupled to the charge pump and being configured to generate a regulated voltage; and
   an oscillator circuit having an oscillation frequency;
   wherein the voltage regulator comprises:
      a first transistor, the first transistor having a first gate terminal, a first terminal coupled to the high voltage signal, a second terminal generating the regulated voltage in response to a control signal that is applied to the gate terminal;
      a first voltage divider having a first end coupled to the second terminal of the first transistor and a second end coupled to a voltage potential, the first voltage divider being configured to output a first divided voltage;
      a second voltage divider having a third end coupled to the high voltage signal and a fourth end coupled to the voltage potential, the second voltage divider being configured to output a second divided voltage; and
      an operational amplifier having a first input terminal coupled to a reference voltage, a second input terminal coupled to the first divided voltage, and a first output terminal coupled to the gate terminal of the first transistor.

2. The high-voltage regulator of claim 1, wherein the first transistor is a p-channel MOS transistor.

3. The high-voltage regulator of claim 1, wherein the first transistor is turned off when the first divided voltage is equal to or greater than the reference voltage.

4. The high-voltage regulator of claim 1, wherein the oscillator circuit comprises:
   a ring oscillator;
   a second transistor interposed between the ring oscillator and a power supply voltage;
   wherein the second transistor comprises:
      a third terminal coupled to the power supply voltage;
      a fourth terminal coupled to the ring oscillator; and
      a second gate terminal coupled to the second divided voltage.

5. The high-voltage regulator of claim 4, wherein the ring oscillator comprises an odd number of CMOS inverters connected in series having an output of a last inverter coupled to an input of a first inverter.

6. The high-voltage regulator of claim 4, wherein the second transistor is a p-channel MOS transistor.

7. The high-voltage regulator of claim 1, wherein the voltage potential is a ground potential.

8. The high-voltage regulator of claim 1, wherein the first voltage divider comprises two resistors connected in series.

9. The high-voltage regulator of claim 1, wherein the second voltage divider comprises two resistors connected in series.

10. The high-voltage regulator of claim 1, wherein the second divided voltage controls the oscillation frequency.

11. The high-voltage regulator of claim 1 further comprising a voltage-controlled current generator, wherein the a voltage-controlled current generator is interposed between the second voltage divider and the second transistor.

12. The high-voltage regulator of claim 11, wherein the voltage-controlled current generator comprises:
   a third transistor having a third gate terminal, a fifth terminal coupled to the power supply voltage and a sixth terminal;
   a fourth transistor having a fourth gate terminal, a seventh terminal coupled to the power supply voltage and an eighth terminal;
   a fifth transistor having a fifth gate terminal, a ninth terminal coupled to the sixth terminal of the third transistor and a tenth terminal;
   a first resistor having a fifth end coupled to the tenth terminal of the fifth transistor and a sixth end coupled to the voltage potential, the first resistor being configured to receive a first control signal;
   a second resistor having a seventh end coupled to the eighth terminal of the fourth transistor and an eighth end coupled to the voltage potential, the second resistor being configured to generate a second control voltage; and
   a second operational amplifier having a third input terminal coupled to the second divided voltage, a second input terminal coupled to the first control signal, and a second output terminal coupled to a fifth gate terminal of the fifth transistor;
   wherein the third and fourth gate terminals are coupled together.

13. The high-voltage regulator of claim 12, wherein the voltage-controlled current generator further comprises a capacitor coupled to the eighth terminal of the fourth transistor.

14. The high-voltage regulator of claim 12, wherein the third and fourth transistors are p-channel transistors.

15. The high-voltage regulator of claim 12, wherein the fifth transistor is a n-channel transistor.

* * * * *